United States Patent [19]

Brown

[11] Patent Number: 4,646,036

[45] Date of Patent: Feb. 24, 1987

[54] SIGNAL ATTENUATION CIRCUIT

[75] Inventor: Mark J. Brown, Phoenix, Ariz.

[73] Assignee: Motorola, Inc., Schaumburg, Ill.

[21] Appl. No.: 812,883

[22] Filed: Dec. 23, 1985

[51] Int. Cl.[4] .............................................. H01P 1/22
[52] U.S. Cl. ................................. 333/81 R; 307/264; 330/134; 330/145; 330/280; 330/284
[58] Field of Search ............... 330/134, 138, 145, 280, 330/284; 333/81 R; 455/249; 307/565, 264

[56] References Cited

U.S. PATENT DOCUMENTS

| | | | |
|---|---|---|---|
| 3,222,609 | 12/1965 | Ulmer et al. | 330/145 X |
| 3,386,034 | 5/1968 | Entwistle | 455/249 |
| 3,624,561 | 11/1971 | Tongue | 330/145 X |
| 4,019,160 | 4/1977 | Kam | 333/81 R |
| 4,236,126 | 11/1980 | Weller et al. | 333/81 R |
| 4,369,414 | 1/1983 | Aoki et al. | 333/81 R |

FOREIGN PATENT DOCUMENTS

| | | | |
|---|---|---|---|
| 42959 | 4/1979 | Japan | 333/81 R |
| 1083259 | 3/1984 | U.S.S.R. | 333/81 R |

Primary Examiner—James B. Mullins
Attorney, Agent, or Firm—Lowell W. Gresham

[57] ABSTRACT

A circuit which attenuates an RF signal in response to a voltage level of a control signal is disclosed. A first PIN diode resides in series with an RF signal path, and a second PIN diode shunts the RF signal path to ground. A first differential amplifier responsive to the control signal drives the first PIN diode, and a second differential amplifier responsive to the control signal drives the second PIN diode. Gain and maximum current output for each of the amplifiers are independently controlled. Additionally, separate reference voltage sources may apply to one input of each of the differential amplifiers.

10 Claims, 3 Drawing Figures

SIGNAL ATTENUATION CIRCUIT

STATEMENT OF GOVERNMENT INTEREST

The Government has rights in this invention pursuant to Contract No. F33657-83-C-0122 awarded by the Air Force.

BACKGROUND OF THE INVENTION

This invention relates to attenuation circuits such as are employed in automatic gain control (AGC) functions. Specifically, the present invention relates to attenuation circuits in which a signal is attenuated to a degree determined by a level of a control signal. More specifically, the present invention pertains to attenuation circuits which use a plurality of PIN diodes to effect the attenuation.

Conventional AGC circuits may incorporate attenuators which contain a plurality of PIN diodes arranged in "pi", "T", or "L" networks. The use of a plurality of PIN diodes widens the dynamic range of attenuation achievable over circuits which utilize only one PIN diode. Although a wide dynamic range represents a desirable feature, these AGC circuits often additionally exhibit one or more undesirable characteristics.

Some attenuator circuits have a structure in which a significant amount of current flows through portions of the attenuator which do not bias PIN diodes. As a result, such circuits consume a relatively high amount of power and may not be suitable for applications where circuits are powered by a battery.

Additionally, some attenuator circuits inhibit flexibility in adapting a given control signal to produce a desired attenuation curve. Many parameters characterize the manner in which attenuation may vary as a function of the control signal. For example, the range of control signal levels corresponding to an attenuation range, polarity of control signal changes relative to corresponding attenuation changes, and the amount of attenuation change corresponding to a given control signal level change are parameters which may not be independently controlled in such circuits. Accordingly, such circuits may not be suitable for applications which require precise control of attenuation by a control signal.

Further, other attenuator circuits exhibit parameters which excessively drift as the attenuators encounter temperature changes. These attenuators are not suitable for applications which require successful operation over a wide temperature range.

SUMMARY OF THE INVENTION

Accordingly, it is an object of the present invention to provide an improved attenuator circuit which operates using a relatively small amount of power so that it may be energized by a battery.

Another object of the present invention concerns independently controlling a plurality of parameters which characterize the relationship between a control signal and a desired attenuation so that precise control of the attenuation results.

Yet another object of the present invention concerns providing an attenuator having a relatively wide dynamic range of attenuation.

The above and other objects and advantages of the present invention are carried out in one form by an attenuator which includes two PIN diodes and two amplifiers. The two PIN diodes couple together so that one PIN diode resides in series with the signal to be attenuated and the other shunts the signal to ground. Each of the two amplifiers biases different ones of the two PIN diodes. The two amplifiers are driven by a common control signal.

BRIEF DESCRIPTION OF THE DRAWINGS

A more complete understanding of the present invention may be derived by reference to the detailed description and claims when considered in connection with the accompanying drawings, in which like reference numbers indicate similar parts, and wherein:

DETAILED DESCRIPTION OF THE PREFERRED EMBODIMENTS

Figure 1:
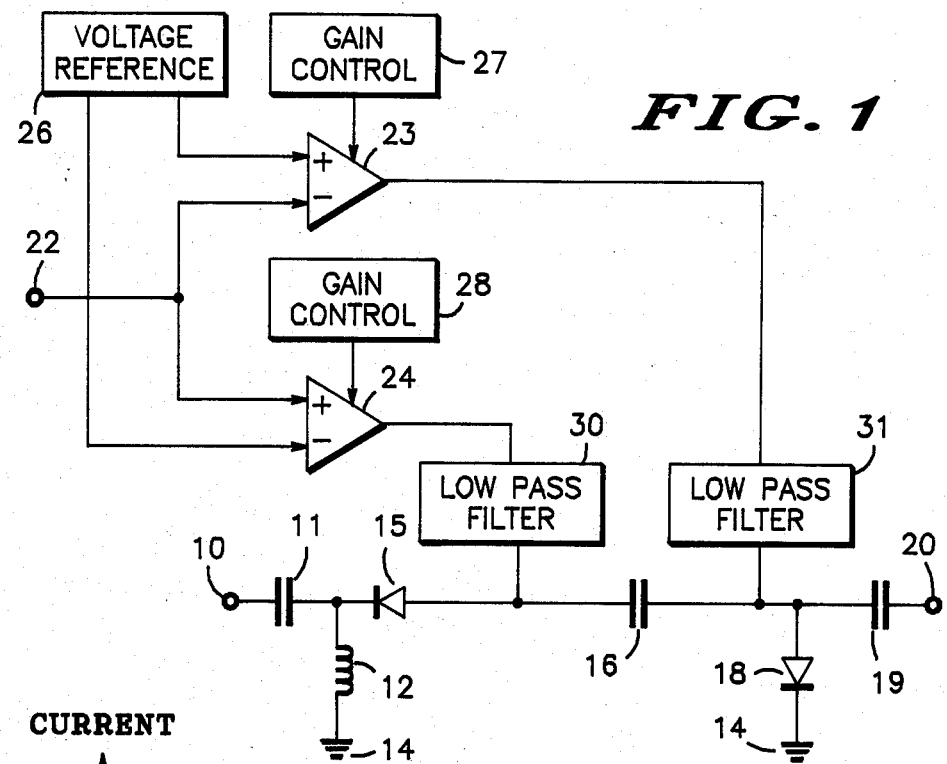
FIG. 1 shows a block diagram of a first embodiment of the present invention.

In an embodiment of the present invention shown as a block diagram in FIG. 1, a terminal 10 receives an RF signal. Terminal 10 couples to a first node of a blocking capacitor 11, and a second node of capacitor 11 couples to a first node of an inductor 12 and to a cathode of a PIN diode 15. A second node of inductor 12 couples to a terminal 14 adapted to receive a common potential, or ground. An anode of PIN diode 15 couples to a first node of a blocking capacitor 16, and a second node of capacitor 16 couples to an anode of a PIN diode 18 and a first node of a blocking capacitor 19. A cathode of PIN diode 18 couples to ground 14. Additionally, a second node of capacitor 19 couples to a terminal 20. Thus, PIN diode 15 lies in series with an RF signal path and PIN diode 18 shunts the RF signal path to ground 14.

PIN diodes 15 and 18 present impedances to the RF signal which decrease as bias current of the PIN diodes increases. Thus, the present invention forms an attenuator which provides the RF signal at terminal 20 attenuated relative to the RF signal applied at terminal 10. Maximum attenuation of the RF signal occurs when substantially no bias current flows through PIN diode 15 and a first maximum amount of current biases PIN diode 18. Conversely, the RF signal is minimally attenuated when a second maximum amount of bias current flows through PIN diode 15 and substantially no current biases PIN diode 18. This second maximum amount of bias current is great enough that PIN diode 15, which is in series with the RF signal path, provides an acceptably low insertion loss.

The anodes of PIN diodes 15 and 18 receive the bias currents (discussed below) for PIN diodes 15 and 18, respectively. Accordingly, blocking capacitor 16 isolates bias current for PIN diode 15 from bias current for PIN diode 18 while permitting passage of the RF signal. Likewise, blocking capacitor 11 isolates bias current for PIN diode 15 from terminal 10, and blocking capacitor 19 isolates bias current for PIN diode 18 from terminal 20. Inductor 12 provides a path to ground for the current which biases PIN diode 15 while presenting a relatively high impedance to the RF signal. Accordingly, inductor 12 has only an insubstantial effect on the RF signal.

A terminal 22 receives a control signal which causes the bias currents to be applied to PIN diodes 15 and 18.

Terminal 22 couples to an inverting input of a differential amplifier 23 and to a non-inverting input of a differential amplifier 24. A voltage reference source 26 has a first output which couples to an inverting input of amplifier 24 and a second output which couples to a non-inverting input of amplifier 23. A gain controller 27 has an output which couples to a control input of amplifier 23, and a gain controller 28 has an output which couples to a control input of amplifier 24. An output of amplifier 23 couples to an input of a low pass filter 31, and an output of amplifier 24 couples to an input of a low pass filter 30. Finally, an output of low pass filter 31 couples to the anode of PIN diode 18, and an output of low pass filter 30 couples to the anode of PIN diode 15.

In this embodiment of the present invention the control signal applied at terminal 22 consists of a voltage level which is inversely proportional to the attenuation of the RF signal applied at terminal 10. As the voltage level of the control signal increases, the attenuation of the RF signal decreases. The first output of voltage reference 26 provides a first reference voltage. The first reference voltage defines the voltage level at which the control signal causes amplifier 24 to output a positive voltage that biases PIN diode 15 in an ON state. An increase in the voltage level of the control signal causes amplifier 24 to increase the bias current to PIN diode 15 under the influence of gain controller 28. Gain controller 28 sets the gain of amplifier 24. Thus, a greater gain associated with amplifier 24 causes a greater increase in bias current through PIN diode 15 in response to a given increase in the voltage level of the control signal. Accordingly, the precise voltage level at which PIN diode 15 is biased in the ON state may be controlled by setting the voltage level of the first reference voltage. Further, an increase in bias current flowing through PIN diode 15 responds to an increase in voltage of the control signal in a manner independently defined by gain controller 28.

Amplifier 23 operates in a manner opposite to that described above for amplifier 24. Thus, the second output from voltage reference 26 provides a second reference voltage. The second reference voltage defines the voltage level at which the control signal causes amplifier 23 to output a positive voltage and bias PIN diode 18 in an ON state. An increase in the voltage level of the control signal causes amplifier 23 to decrease the bias current to PIN diode 18 under the influence of gain controller 27. The same increase in the control signal voltage level causes amplifier 24 to increase bias current to PIN diode 15.

Gain controller 27 sets the gain of amplifier 23. Thus, a greater gain associated with amplifier 23 causes a greater decrease in bias current through PIN diode 18 in response to a given increase in the voltage level of the control signal. Accordingly, the precise voltage level at which PIN diode 18 is biased in the ON state may be controlled by setting the voltage level of the second reference voltage. Further, a decrease in bias current flowing through PIN diode 18 results from an increase in voltage of the control signal in a manner independently defined by gain controller 27.

Low pass filters 30 and 31 isolate the outputs of amplifiers 24 and 23, respectively, from the RF signal. Additionally, low pass filters 30 and 31 may contain resistive elements (not shown) which limit current and convert voltage output from amplifiers 24 and 23 into current.

Figure 2:
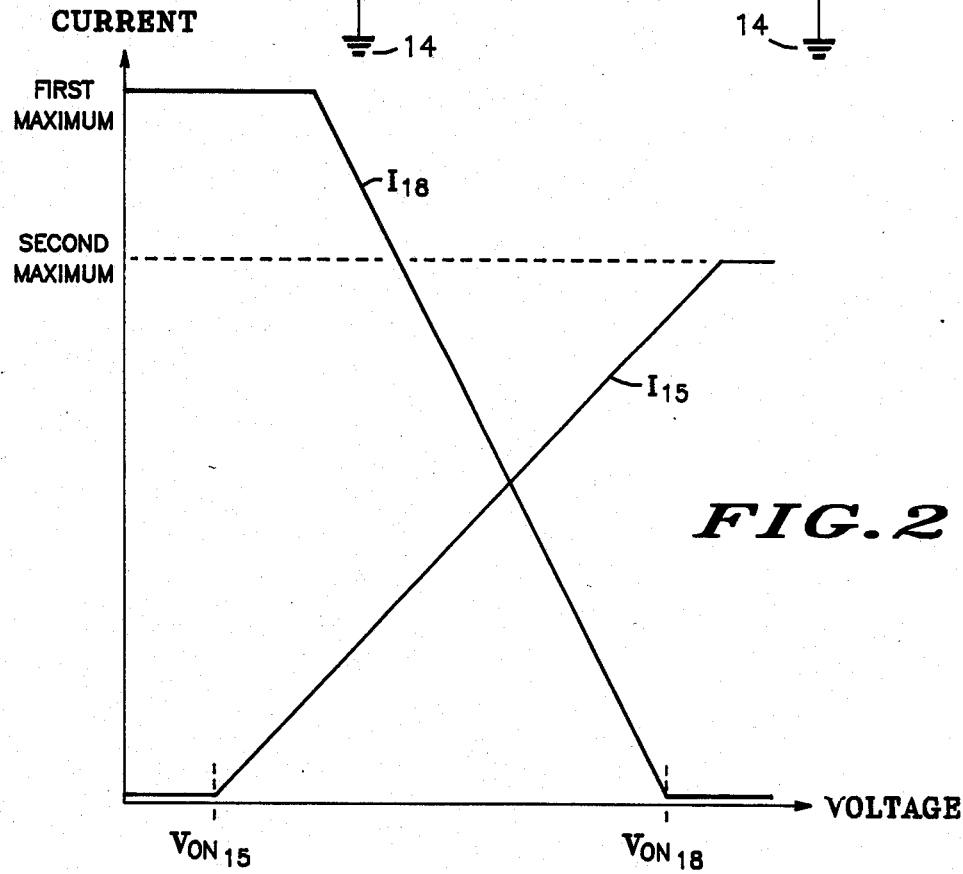
FIG. 2 shows a graphical representation of bias current for PIN diodes versus voltage of a control signal.

FIG. 2 shows a graph of bias current flowing through PIN diodes 15 and 18 of FIG. 1 in response to the control signal. A trace labeled $I_{15}$ depicts the bias current flowing through PIN diode 15, and a trace labeled $I_{18}$ depicts the bias current flowing through PIN diode 18. As the control signal exhibits a minimal voltage, current $I_{18}$ exhibits the first maximum current value and current $I_{15}$ exhibits a minimum value. Maximum attenuation results. Increasing the control signal voltage level to a value labeled $Von_{15}$ causes PIN diode 15 to conduct current. The first output of voltage reference 26 (see FIG. 1) determines voltage $Von_{15}$. As the control signal voltage increases, current $I_{15}$ increases at a substantially linear rate determined by gain controller 28 (see FIG. 1).

Meanwhile, increasing the voltage level of the control signal causes current $I_{18}$ to decrease at a substantially linear rate determined by gain controller 27 (see FIG. 1). When the control signal achieves a voltage level labeled $Von_{18}$, current $I_{18}$ exhibits a minimal value. The second output of voltage reference 26 (see FIG. 1) sets voltage level $Von_{18}$. The control signal voltage levels at which currents $I_{18}$ and $I_{15}$ achieve the first and second maximum levels, respectively, result from the rates and voltages $Von_{15}$ and $Von_{18}$ chosen as described above. Minimum attenuation results when the control signal exhibits a voltage greater than both $Von_{18}$ and the voltage level at which current $I_{18}$ exhibits the first maximum level.

Accordingly, a precisely controllable attenuation function results. The first and second maximum values achievable for currents $I_{18}$ and $I_{15}$ are independently adjustable by limiting the current provided by amplifiers 23 and 24 (see FIG. 1). The control signal voltage levels at which PIN diodes 15 and 18 are biased in the ON state are independently controlled by adjusting the voltage levels output by the first and second outputs of voltage reference 26 (see FIG. 1). Further, the rates at which PIN diodes 15 and 18 attenuate the RF signal in response to changes in the control signal are independently adjustable through gain controllers 28 and 27 (see FIG. 1). Overall attenuation of the RF signal may be calculated by those skilled in the art using data from traces similar to those shown in FIG. 2 and data related to particular PIN diodes. Additionally, a relatively wide dynamic attenuation range results due to the use of two PIN diodes and by increasing the first and second maximum bias current levels as much as possible within limits imposed by power consumption constraints.

Figure 3:
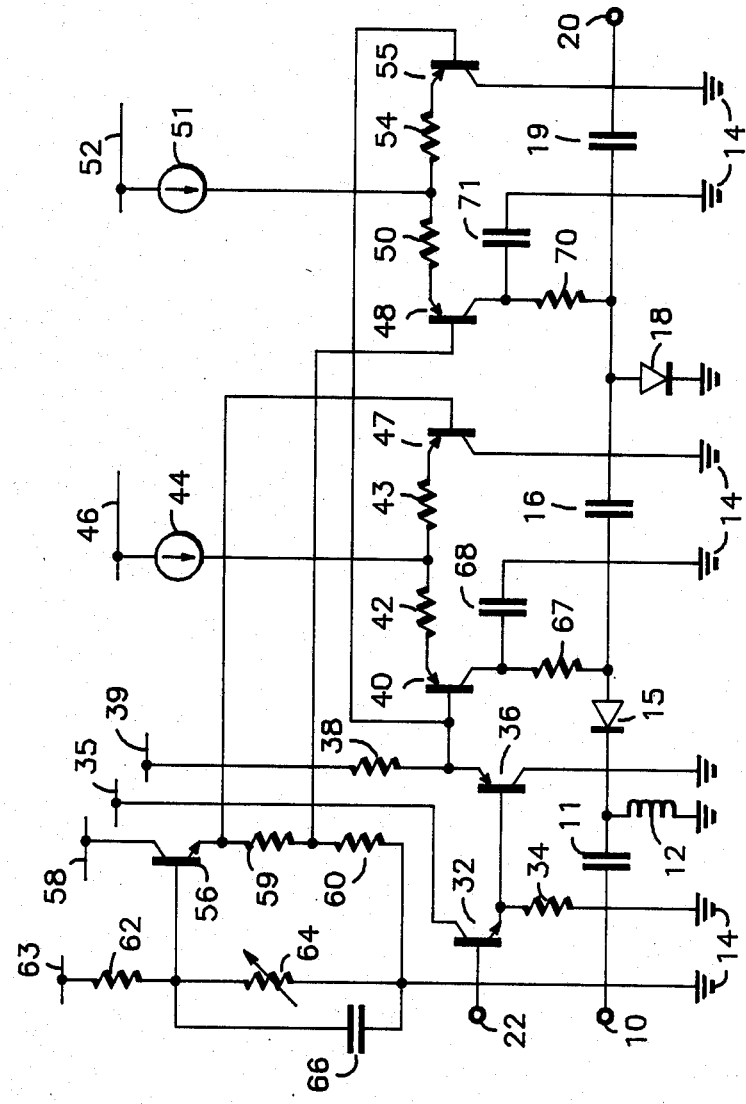
FIG. 3 shows a schematic diagram of a second embodiment of the present invention.

FIG. 3 shows a schematic diagram of an embodiment of the present invention suitable for low power operation. The FIG. 3 schematic is similar to the embodiment shown in FIG. 1. In FIG. 3 terminal 10 receives an RF signal. As in FIG. 1 the RF signal passes through blocking capacitor 11, PIN diode 15, blocking capacitor 16, blocking capacitor 19, and emerges at terminal 20. Likewise, inductor 12 provides a return path for bias current flowing from the cathode of PIN diode 15, PIN diode 18 shunts the RF signal path at its anode to ground, and terminal 22 receives the control signal.

In the FIG. 3 embodiment terminal 22 connects to a base node of an NPN transistor 32, a collector node of transistor 32 connects to a positive voltage source 35, and an emitter node of transistor 32 couples to ground 14 through a series connected resistor 34. The emitter of transistor 32 additionally connects to a base node of a PNP transistor 36. An emitter node of transistor 36 couples to positive voltage source 39 through a series connected resistor 38, and a collector of transistor 36 connects to ground 14.

Transistors 32 and 36 both serve as emitter followers. Transistors 32 and 36 together with resistors 34 and 38 represent a buffer for the control signal applied at terminal 22. Thus, the control signal appears at the emitter of transistor 36 at substantially the same voltage level as the control signal exhibits at terminal 22. The use of diverse polarity transistors, such as one NPN and one PNP, forms a relatively stable buffer over temperature extremes because the temperature characteristics of the NPN transistor tend to cancel out the temperature characteristics of the PNP transistor.

The emitter of transistor 36 connects to a base node of a PNP transistor 40 and to a base node of a PNP transistor 55. A collector node of transistor 40 connects to a first node of a resistor 67 and a first node of a capacitor 68. A second node of capacitor 68 connects to ground 14, and a second node of resistor 67 connects to the anode of PIN diode 15. An emitter node of transistor 40 connects to an output of a current source 44 through a series connected resistor 42. An input of current source 44 couples to a positive voltage source 46. The output of current source 44 additionally couples to an emitter node of a PNP transistor 47 through a series connected resistor 43. A collector node of transistor 47 connects to ground 14, and a base node of transistor 47 is adapted to receive a first reference voltage (discussed below).

A collector node of transistor 55 connects to ground 14, and an emitter node of transistor 55 couples to an output of a current source 51 through a series connected resistor 54. An input of current source 51 couples to a positive voltage source 52. The output of current source 51 additionally couples to an emitter node of a PNP transistor 48 through a series connected resistor 50. A collector node of transistor 48 couples to a first node of a capacitor 71 and to a first node of a resistor 70. A second node of capacitor 71 connects to ground 14, and a second node of resistor 70 connects to the anode of PIN diode 18. A base node of transistor 48 is adapted to recieve a second reference voltage (discussed below).

Transistors 40 and 47 form a differential amplifier similar to amplifier 24 shown in FIG. 1. Further, resistors 42 and 43 act as gain controller 28 (see FIG. 1), and resistor 67 in connection with capacitor 68 act as low pass filter 30 (see FIG. 1). Likewise, transistors 48 and 55 together form a differential amplifier similar to amplifier 23 in FIG. 1, resistors 50 and 54 form a gain controller similar to gain controller 27 (see FIG. 1), and resistor 70 and capacitor 71 form a low pass filter similar to low pass filter 31 (see FIG. 1). Current sources 44 and 51 each represent devices which provide constant current, such as may be obtained through the use of a current mirror circuit.

The differential amplifiers shown in FIG. 3 couple to the reference voltages and control signal so that attenuation increases as the voltage level of the control signal increases. This represents a polarity opposite to that described above in FIG. 1. Thus, as the voltage level of the control signal increases, the current provided by current source 44 is diverted more through transistor 47 to ground than through transistor 40 and PIN diode 15. Consequently, an increase in control signal voltage increases the impedance of PIN diode 15. Further, an increase in control signal voltage causes the current provided by current source 51 to divert more through transistor 48 and PIN diode 18 than through transistor 55 to ground. Accordingly, an increase in control signal voltage decreases the impedance of PIN diode 18. However, those skilled in the art will recognize that polarity of the present embodiment may be reversed by reversing the connections at the bases of transistors 40 and 47 along with the connections at the bases of transistors 48 and 55.

Resistors 42 and 43 set the gain of the differential amplifier formed from transistors 40 and 47. Resistors 42 and 43 preferably exhibit the same resistance value and a low temperature coefficient. Larger resistance values for resistors 42 and 43 produce smaller gains. Additionally, larger resistance values reduce the impact that the temperature coefficients of transistors 40 and 47 have on the amplifier formed thereof. Accordingly, the temperature coefficients of resistors 42 and 43 become more significant as their resistance values increase. In the preferred embodiment of the present invention current source 44 provides a constant current in the range of 50-300 microamps, and resistors 42 and 43 each exhibit a value of around 200 ohms.

Resistors 50 and 54 along with transistors 48 and 55 operate similarly to the relationship of resistors 42 and 43 relative to transistors 40 and 47. However, as described above in connection with FIGS. 1 and 2, the amplifier formed from transistors 48 and 55 need not exhibit the same gain or provide the same maximum amount of current as provided by the amplifier formed from transistors 40 and 47. Thus, the resistance values of resistors 50 and 54 need not equal the resistance values for resistors 42 and 43, and the current provided by current source 51 need not equal the current provided by current source 44.

The first and second reference voltages mentioned above are provided by a circuit which serves as voltage reference 26 shown in FIG. 1. This circuit utilizes an NPN transistor 56 having a collector node coupled to a positive voltage source 58. An emitter node of transistor 56 connects to the base node of transistor 47 and provides the first reference voltage. Additionally, the emitter node of transistor 56 connects to a first node of a resistor 59. A second node of resistor 59 connects to a first node of a resistor 60 and to the base node of transistor 48. Thus, the second node of resistor 59 provides the second reference voltage. A second node of resistor 60 connects to ground 14. A base node of transistor 56 couples to a positive voltage source 63 through a series connected resistor 62. Additionally, the base of transistor 56 couples to ground 14 through a series connected variable resistor 64. A capacitor 66 connects in parallel with resistor 64.

Variable resistor 64 sets the voltage level of the first reference voltage. The second reference voltage exhibits a level less than the first reference voltage. The difference between the first and second reference voltages depends substantially on the ratio of resistance values of resistors 59 and 60. Those skilled in the art will recognize that connections to the bases of transistors 47 and 48 may be reversed when a particular application requires the reference voltage applied at the base of transistor 48 to be greater than the reference voltage applied at the base of transistor 47.

Accordingly, the present embodiment provides a low power signal attenuation circuit. Only insubstantial amounts of current flow through portions of the attenuator which do not directly bias the PIN diodes. In addition the present embodiment is suitable for implementation within an integrated circuit to minimize space requirements and promote temperature stability by having all active components experiencing substantially similar temperatures.

The foregoing description uses preferred embodiments to illustrate the present invention. However, those skilled in the art will recognize that changes and modifications may be made in these embodiments without departing from the scope of the present invention. For example, terminal 20 may serve as an RF input to the present invention with terminal 10 acting as an RF output terminal. Further, even though separate reference voltages are described above as being applied to separate amplifiers, those skilled in the art will recognize that some applications may permit a single reference voltage to be applied to separate amplifiers and that many diverse conventional circuits may advantageously provide the reference voltages. Additionally, the polarities, including the polarities of transistors and PIN diodes, mentioned above are largely reversible to those skilled in the art. These and other modifications obvious to those skilled in the art are intended to be included within the scope of this invention.

I claim:

1. A circuit for attenuating an RF signal in response to a voltage level of a control signal, the circuit comprising:
   a first PIN diode having an anode and a cathode, a first one of the anode and cathode of said first PIN diode being adapted to transport the RF signal;
   a second PIN diode having an anode and a cathode, a first one of the anode and cathode of said second PIN diode being adapted to receive a common potential, and a second one of the anode and cathode of said second PIN diode being coupled to a second one of the anode and cathode of said first PIN diode;
   a first differential amplifier having first and second signal inputs and an output, the first signal input of said first amplifier being adapted to receive a first reference potential, the second signal input of said first amplifier being adapted to receive the control signal, and the output of said first amplifier being coupled to one of the anode and cathode of said first PIN diode;
   a second differential amplifier having first and second signal inputs and an output, the first signal input of said second amplifier being adapted to receive a second reference potential, the second signal input of said second amplifier being adapted to receive the control signal, and the output of said second amplifier being coupled to the second one of the anode and cathode of said second PIN diode;
   means, coupled to said first differential amplifier, for setting a gain parameter of said first differential amplifier at a first predetermined level; and
   means, coupled to said second differential amplifier, for setting a gain parameter of said second differential amplifier at a second predetermined level.

2. A circuit as claimed in claim 1 wherein said first differential amplifier comprises:
   a first transistor having base, emitter, and collector nodes, said first transistor base being coupled to the second signal input of said second amplifier, said first transistor collector being coupled to said first PIN diode, and said first transistor emitter being coupled to said means for setting a gain parameter of said first differential amplifier; and
   a second transistor having base, emitter, and collector nodes, said second transistor base being adapted to receive the first reference potential, said second transistor collector being adapted to receive the common potential, and said second transistor emitter being coupled to said means for setting a gain parameter of said first differential amplifier.

3. A circuit as claimed in claim 2 wherein said means for setting a gain parameter of said first differential amplifier comprises:
   a first resistor having a first node coupled to the emitter of said first transistor and having a second node; and
   a second resistor having a first node coupled to the emitter of said second transistor and having a second node coupled to the second node of said first resistor.

4. A circuit as claimed in claim 1 additionally comprising a first low pass filter coupled between a first one of said first amplifier and said first PIN diode and said second amplifier and said second PIN diode, respectively.

5. A circuit as claimed in claim 4 additionally comprising a second low pass filter coupled between a second one of said first amplifier and said first PIN diode and said second amplifier and said second PIN diode, respectively.

6. A circuit as claimed in claim 1 additionally comprising means, coupled to the second signal inputs of said first and second amplifiers, for buffering the control signal.

7. A circuit as claimed in claim 6 wherein said means for buffering comprises:
   an NPN transistor having a base and an emitter; and
   a PNP transistor having a base and an emitter, the base of a first one of said NPN and PNP transistors being coupled to the emitter of a second one of said NPN and PNP transistors, and the emitter of the first one of said NPN and PNP transistors being coupled to the second signal inputs of said first and second amplifiers.

8. A circuit as claimed in claim 1 additionally comprising an inductor coupled between one of the anode and cathode of said first PIN diode and the first one of the anode and cathode of said second PIN diode.

9. A circuit as claimed in claim 8 additionally comprising:
   a first capacitor coupled in series with the first one of the anode and cathode of said first PIN diode;
   a second capacitor coupled between the second one of the anode and cathode of said second PIN diode and the second one of the anode and cathode of said first PIN diode; and
   a third capacitor coupled to the second one of the anode and cathode of said second PIN diode.

10. A circuit as claimed in claim 1 additionally comprising:
    means, coupled to said first differential amplifier, for limiting bias current flow through said first PIN diode to a first maximum value; and
    means, coupled to said second differential amplifier, for limiting bias current flow through said second PIN diode to a second maximum value.

* * * * *